United States Patent [19]
Salami et al.

[11] Patent Number: 5,928,438
[45] Date of Patent: *Jul. 27, 1999

[54] STRUCTURE AND FABRICATION PROCESS FOR SELF-ALIGNED LOCALLY DEEP-DIFFUSED EMITTER (SALDE) SOLAR CELL

[75] Inventors: Jalal Salami, West Mifflin; Akio Shibata, Pittsburgh; Daniel L Meier, Pittsburgh; Edgar L Kochka, Pittsburgh, all of Pa.

[73] Assignee: Ebara Solar, Inc., Large, Pa.

[ * ] Notice: This patent issued on a continued prosecution application filed under 37 CFR 1.53(d), and is subject to the twenty year patent term provisions of 35 U.S.C. 154(a)(2).

[21] Appl. No.: 08/726,279

[22] Filed: Oct. 4, 1996

Related U.S. Application Data

[60] Provisional application No. 60/004,833, Oct. 5, 1995.

[51] Int. Cl.$^6$ ..................................................... H01L 31/00
[52] U.S. Cl. ............................................. 136/255; 136/256
[58] Field of Search ..................................... 136/255, 256

[56] References Cited

U.S. PATENT DOCUMENTS

| | | | |
|---|---|---|---|
| 2,841,860 | 7/1958 | Koury | 29/25.3 |
| 2,854,363 | 9/1958 | Seiler | 148/1.5 |
| 3,134,906 | 5/1964 | Henker | 250/211 |
| 4,070,689 | 1/1978 | Coleman et al. | 357/30 |
| 4,341,589 | 7/1982 | Grabmaier | 132/115 |
| 4,428,783 | 1/1984 | Gessert | 330/331 |
| 4,523,966 | 6/1985 | Tsuya et al. | 148/171 |
| 4,665,277 | 5/1987 | Sah et al. | 136/255 |
| 4,703,553 | 11/1987 | Mardesich | 136/255 |
| 5,156,978 | 10/1992 | Bathey et al. | 437/2 |

OTHER PUBLICATIONS

Article by R.B. Campbell and D. L. Meier, entitled: "Simultaneous Junction Formation Using a Directed Energy Light Source" Published by Journal of the Electrochemical Society, 1986, vol. 131, pp. 2210–2211.

Article by R. Schindler, I. Reis, B. Wagner, A. Eyer, H. Lautenschlager, C. Schetter, entitled: "Rapid Optical Thermal Processing of Silicon Solar Cells" Published by Conference Record 23$^{rd}$ IEEE Photovoltaic Specialists Conference (93CH3283–9 0160–8371) (Louisville, KY), 1993, pp. 162–166.

Article by J. L. Murray and A. J. McAlister, entitled: "The Al–Si (Aluminum–Silicon) System" Published by Bulletin of Alloy Phase Diagrams, vol. 5, No. 1, 1984, pp. 74–84.

Article by P. Lölgen, C. Leguijt, J. A. Eikelboom, R. A. Steeman, W.C. Sinke, L. A. Verhoef, P.F. A. Alkemade and E. Algra, entitled: "Aluminum Back–Surface Field Doping Profiles with Surface Recombinatin Velocities Below 200 cm/s" Published by Conference Record 23$^{rd}$ IEEE Photovoltaic Specialists Conference (93CH3283–9 0160–8371) (Louisville, KY), 1993, pp. 236–242.

Article by Peyman Sana, Jalal Salami, and Ajeet Rohatgi, entitled: "Fabrication and Analysis of High–Efficiency Polycrystalline Silicon Solar Cells" Published by IEEE Transactions on Electron Devices, vol. 40, No. 8, 1993, pp. 1461–1468.

(List continued on next page.)

*Primary Examiner*—Mark Chapman
*Attorney, Agent, or Firm*—Graham & James LLP

[57] ABSTRACT

A solar cell having self-aligned metal electrodes and underlying relatively deep emitter regions joined by relatively shallow emitter regions under the surface not covered by the electrodes is formed in a semiconductive substrate by forming relatively shallow p+ and n+ diffusion regions on the front and back surfaces, respectively, of a silicon semiconductive substrate, screen printing aluminum onto the front surface of the substrate in a desired electrode pattern, heat treating the developing cell to form the relatively deep p+ type emitter regions underneath the electrode pattern, while growing an oxide passivation layer over the uncovered portions of the substrate surface, applying an antireflective coating to the front surface in the regions not covered by the electrodes, and screen printing silver over the electrodes on the front surface and over the back surface of the solar cell.

26 Claims, 5 Drawing Sheets

OTHER PUBLICATIONS

Article by J. Nijs, E. Demesmaeker, J. Szlufcik, J. Poortmans, L. Frisson, K. De Clercq, M. Ghannam, R. Mertens, R. Van Overstraeten, entitled: "Latest Efficiency Results with the Screenprinting Technology and Comparison with the Buried Contact Structure" Published by Conference Record first World Conference On Photovoltaic Energy Conversion (Waikoloa, Hawaii), Dec. 5–9, 1994, pp. 1242–1249.

Article by M. A. Green, C. M. Chong, F. Zhang, A. Sproul, J. Zolper and S.R. Wenham, entitled: "20° Efficient Laser Grooved, Buried Contact Silicon Solar Cells" Published by Conference Record $20^{th}$ IEEE Photovoltaic Specialists Conference (88CH2527–0) (Las Vegas, NV), 1988, pp. 411–414.

Article by James A. Amick, Frank J. Bottari, and Jack I. Hanoka, entitled: "The Effect of Aluminum Thickness on Solar Cell Performance" Published by Journal of the Electrochemical Society, vol. 141, No. 6, Jun. 1994, pp. 1577–1585.

Article by A Rohatgi, P. Sana, M. S. Ramanachalam, J. Salami, and W. B. Carter, entitled: "Investigation of the Effects of Aluminum Treatment on Silicon Solar Cells" Published by Conference Record $23^{rd}$ IEEE Photovoltaic Specialists Conference (93CH3283–9 0160–8371) (Louisville, KY), 1993, pp. 52–57.

Article by C. Cheek, M. Eyckmans and R. Mertens, entitled: "Aluminum Alloy High Efficiency Solar Cells" Published by Conference Record $18^{th}$ IEEE Photovoltaic Specialists Conference (85CH2208–7) (Las Vegas, NV), 1985, pp. 190–191.

Article by Calvin, Y. C. Leung and Y. W. Lam, entitled: "Alloyed Inversion Layer Solar Cells With n–Si Substrates and $TiO_x$ Antireflection Coatings" Published by Thin Solid Films, 142, (1986), pp. 1–11.

Article by V. N. Vysotskii, V. G. Maistrenko, S. V. Potekha, and O. I. Solodukha, entitled "Photovolltaic Cells with Aluminum Alloy Contacts and a Base Partially Doped with Lithium" Published by Applied Solar Energy, 27, 1991, pp. 16–19.

Article by R. G. Seidensticker, entitled: "Dendritic Web Silicon For Solar Cell Application", Published by Journal of Crystal Growth, 39 (1977), pp. 17–22, ©North–Holland Publishing Company, pp. 16–19.

Article by B. R. Bathey, M C. Cretella, and A. S. Taylor, entitled "In–Situ PN Junction Formation During Edge Defined Film–Fed Growth of Silicon" by Conference Record $23^{rd}$ IEEE Photovoltaic Specialists Conference (93CH3283–9 0160–8371) (Louisville, KY), 1993, pp. 117–121.

Article by H. H. Berger, entitled: "Models for Contacts to Planar Devices" Published by Pergamon Press Solid–State Electronics, 1972, vol. 15, pp. 145–158.

Article by Dieter K. Schroder and Daniel L. Meier, entitled: "Solar Cell Contact Resistance—A Review" Published by IEEE Transactions on Electron Devices, vol. ED–31, No. 5 May 1984, pp. 637–647.

Article by A. L. Fahrenbruch and R. H. Bube, entitled: "Fundamentals of Solar Cells" Published by Academic Press, New York, 1983, p. 223.

Article by Jalal Salami, Akio Shibata, Daniel Meier, Edgar Kochka, Satoshi Yamanaka, Preston Davis, John Easoz, Toru Abe, and Kazuo Kinoshita, entitled "Self–Aligned Locally–Diffused Emitter (SALDE) Silicon Solar Cell" Published by $9^{th}$ International Photovoltaic Science and Engineering Conference, Nov. 11–15, 1996 (Miyazaki, Japan), pp. B–III–6, 7.

Article by Jalal Salami, Akio Shibata, Daniel Meier, Edgar Kochka, Satoshi Yamanaka, Preston Davis, John Easoz, Toru Abe, and Kazuo Kinoshita, Solar Energy Materials and Solar Cells 48 Published by $9^{th}$ International Photovoltaic Science and Engineering Conference, (Miyazaki, Japan), (1997) pp. 159–165.

Article by J.P. Kalejs, B.R. Bathey, J.T. Borenstein, and R.W. Stormont, entitled: "Effects of Transition Metal Impurities on Solar Cell Performance in Polycrystalline Silicon", Published by IEEE Jan., 1993 pp. 184–189.

STRUCTURE AND FABRICATION PROCESS FOR SELF-ALIGNED LOCALLY DEEP-DIFFUSED EMITTER (SALDE) SOLAR CELL

CROSS-REFERENCE TO PROVISIONAL APPLICATION

This application claims priority based on Provisional Application Ser. No. 60/004,833 filed Oct. 5, 1995, for STRUCTURE AND FABRICATION PROCESS FOR SELF-ALIGNED LOCALLY DEEP-DIFFUSED EMITTER (SALDE) SOLAR CELL.

BACKGROUND OF THE INVENTION

This invention relates to the field of solar cells for converting solar energy into electrical energy. More particularly, this invention relates to solar cells having front and back electrodes.

Solar cells comprising semiconductor devices employing the photovoltaic effect for converting solar energy into electrical energy have long been known. A typical solar cell comprises a semiconductive substrate provided with metal electrodes on one or more surfaces of the substrate, the electrodes being electrically connected to the substrate at the surface. The vast majority of solar cell designs incorporate a p-n junction within the semiconductive substrate for separating the electrons and holes generated within the body of the semiconductive substrate in response to the incidence of solar radiation. The metal electrodes are characterized as either the p-type electrode, used to collect the holes or the n-type electrode, used to collect electrons. In a single-sided solar cell, both types of electrodes are located on a single major surface of the substrate. In a double-sided solar cell, the electrodes of one type are located on one major surface of the substrate, while the electrodes of the other type are located on the other major surface of the substrate. A common double-sided cell configuration provides a single common electrode on the back surface of the cell and a plurality of electrodes on the front surface of the cell. This plurality of electrodes is made up of a plurality of essentially metal stripes ohmically interconnected by means of a bus bar stripe. Common materials for the front surface electrodes are silver, applied by a screen-printing process, or successive layers of titanium, palladium, and silver, applied by a metal evaporation process. In rare cases, aluminum has been used as the front surface electrode material, and the aluminum is alloyed with silicon. Known techniques for forming the aluminum stripes include evaporating aluminum onto the cell surface using a patterned mask, applying liquid aluminum to the cell surface and screen printing a mixture of aluminum and glass frit onto the cell surface in the stripe pattern. This last technique (screen printing), while convenient, suffers from the disadvantage of introducing high electrical resistance within the electrodes, since glass frit is a good electrical insulator. This disadvantage is particularly severe when the glass frit accumulates at the interface between the substrate material (typically silicon) and the aluminum alloy contact electrode. The actual location of the glass frit after formation of the electrode is dependent upon the details of the processing employed, and the process typically requires a temperature time spike to achieve effective alloying without excessively segregating the glass frit at the interface. This requirement adds complexity to the electrode formation process, which is undesirable. Typically, the non-contacted surfaces between the metal stripes on the cell are passivated using some type of thermal oxide, such as one of the oxides of silicon.

Electrons and holes can recombine at the illuminated surface of the semiconductive substrate or within the bulk of the material. Any such recombination of electrons and holes results in a reduction in solar cell conversion efficiency, and is thus highly undesirable. Recombination at the illuminated surface of the semiconductor substrate can occur in both the metal-electrode contacted region and the region not covered by the metal electrode.

Techniques have been explored for reducing the occurrence of electron-hole recombination at the illuminated semiconductor surface. For the metal-contacted region, the emitter of the p-n junction underlying the metal electrodes should be doped in a preferred range of $1 \times 10^{19}$ cm$^{-3}$ to $1 \times 10^{21}$ cm$^{-3}$, but workable devices can be made doped from $1 \times 10^{19}$ cm$^{-3}$ to $5 \times 10^{21}$ cm$^{-3}$ (termed at least moderately doped herein) and the junction should be relatively deep (e.g. $\geq 2$ $\mu$m) within the substrate. In contrast, for the non-contacted regions between the metal electrodes and under the passivated surface, the emitter portion of the p-n junction should be doped to a concentration of no greater than about $5 \times 10^{18}$ cm$^{-3}$ (termed lightly doped herein) and the junction should be relatively shallow (for example, about 0.2 $\mu$m) within the substrate. Unfortunately, these two techniques pose conflicting requirements for doping the region adjacent the illumination surface of a solar cell. Although these opposing requirements can be implemented, the required processing is costly and complex, which results in a relatively high cost per cell fabricated and relatively low yield of acceptable functioning solar cells. For example, for high efficiency solar cells, the conflicting requirements of the two recombination techniques have been addressed by providing a second doped region under the electrode contact area. While this solution is effective, it requires two photolithography processing steps, two separate diffusion conditions for the emitter region, and an additional photolithography step in order to align the electrode grid pattern to the deeply diffused junction, all of which add substantial cost to the manufacturing process. Consequently, this solution is not consistent with the requirement of low cost for the fabrication of silicon solar cells for many applications.

In addition to the problems imposed by the electron-hole recombination phenomenon, another problem affecting the doping process involves silicon surface passivation. In particular, an effective silicon surface passivation requires a lightly-doped emitter since the observed surface recombination velocity increases with the surface doping concentration. Efforts to date to provide a low cost solar cell with effective reduction of electron-hole recombination have not met with success.

SUMMARY OF THE INVENTION

The invention comprises a solar cell with reduced electron-hole recombination performance, relatively high efficiency including relatively low electrode resistance, which can be fabricated at relatively low cost using simplified fabrication techniques resulting in relatively high yield.

From an apparatus standpoint, the invention comprises a solar cell comprising a semiconductive substrate having first and second surfaces, a first plurality of emitter regions formed in one of the first and second surfaces to a relatively shallow depth preferably with a relatively low dopant concentration, a second plurality of emitter regions formed in said one of the first and second surfaces to a substantially greater depth than the first plurality of regions preferably with a relatively higher dopant concentration than the first plurality of regions, the first and second plurality of regions being interspersed, a dopant region formed in the second one of the first and second surfaces for providing a back surface field, an ohmic contact formed over the dopant region, and a first patterned ohmic electrode layer containing aluminum formed over the second plurality of emitter regions. The semiconductor substrate preferably comprises n-type doped silicon, and the first plurality of emitter regions are preferably formed using a p+ type dopant material, such as boron. The second plurality of emitter regions is preferably formed from a p+ type dopant material comprising either pure aluminum or an alloy of aluminum and silicon. The dopant region formed in the second one of the substrate surfaces is preferably formed using an n+ type dopant material, such as phosphorus.

The depth of the shallow emitter regions is preferably no greater than about 0.2 $\mu$m, and the dopant concentration is preferably no greater than about $5\times10^{18}$ cm$^{-3}$. The minimum depth of the second plurality of deep emitter regions is about 2 $\mu$m, and the dopant concentration is preferably in the range from about $1\times10^{18}$ cm$^{-3}$ to about $5\times10^{21}$ cm$^{-3}$.

The cell is preferably provided with a second patterned layer of a solderable ohmic material, such as silver, over the first patterned ohmic electrode layer. A passivation layer is preferably formed on the one of the first and second surfaces in regions between the first patterned ohmic contact layer. An antireflective layer is preferably formed over the passivation layer.

From a process standpoint, the invention comprises a method of fabricating a solar cell having self-aligned locally deep-diffused emitters, the method including the steps of providing a semiconductive substrate having first and second surfaces, forming a relatively shallow emitter region of a first conductivity type in one of the first and second surfaces, forming a relatively shallow field region of a second conductivity type in the other one of the first and second surfaces, providing a patterned layer containing aluminum on the one of the first and second surfaces, heating the substrate to form a plurality of relatively deep emitter regions of the first conductivity type in the substrate in regions underlying the patterned layer, and providing an ohmic contact to the other one of the first and second surfaces.

The relatively shallow emitter regions are preferably formed using a p+ type dopant material, while the relatively shallow field region is preferably formed using an n+ type dopant material.

The step of forming the relatively shallow emitter region is preferably conducted in order to provide emitter regions having a depth no greater than about 0.2 $\mu$m and a dopant concentration not greater than about $5\times10^{18}$ cm$^{-3}$. The step of heating the substrate is preferably conducted in order to provide emitter regions having a minimum depth of about 2 $\mu$m and a dopant concentration in the range from about $1\times10^{18}$ cm$^{-3}$ to about $5\times10^{21}$ cm$^{-3}$.

The step of providing a patterned layer containing aluminum may be conducted with either pure aluminum or a mixture of aluminum and silicon screen printable pastes in order to control the depth of the deeply-diffused emitter regions. The method may be optionally conducted to provide an ohmic patterned layer of a solderable material, such as silver, over the patterned layer containing aluminum; to form a passivation layer over the one of the first and second surfaces in regions not covered by the patterned layer; and forming a layer of antireflective material over the passivation layer.

The invention provides a number of advantages over known solar cells. The combination of deep, at least moderately doped emitter regions under the electrodes and shallow lightly doped emitter regions under the exposed non-contacted regions acts to minimize recombination of holes and electrons in a functioning solar cell. The use of aluminum as a screen printable paste with or without frit or in a pure form (e.g. evaporated aluminum) can provide a positive contact ohmic electrode material and supply a gettering agent to remove impurities and enhance the bulk lifetime, all in a single process step. The ohmic metal contacts to the deep-diffused emitter regions are self-aligned during the heat treat process step, which eliminates any additional photolithography steps formerly required in known devices. The fritless aluminum eliminates the problem of higher electrical resistance encountered in prior art devices employing a mixture of aluminum and glass frit. The application of the solderable material over the contact electrodes facilitates the interconnection of a plurality of cells together. The invention also provides a solar cell which is tolerant of a non-uniform emitter, since the aluminum electrodes dope the underlying silicon p-type.

For a fuller understanding of the nature and advantages of the invention, reference should be made to the ensuing detailed description, taken in conjunction with the accompanying drawings.

DETAILED DESCRIPTION OF THE PREFERRED EMBODIMENTS

Figure 1:
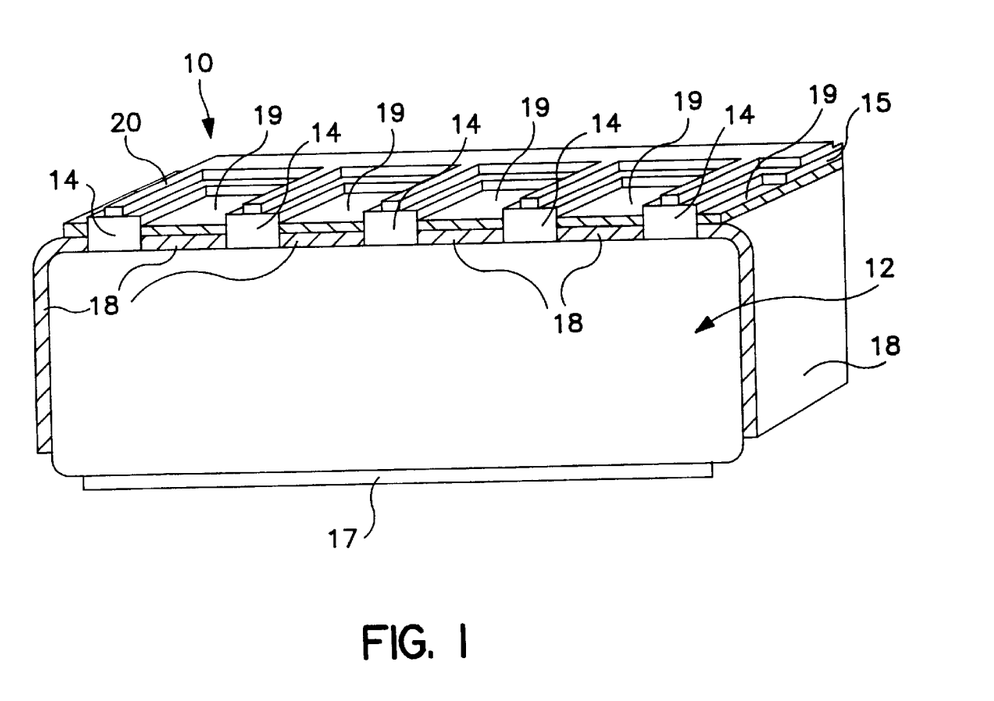
FIG. 1 is a perspective view of a preferred embodiment of the invention.

Turning now to the drawings, FIG. 1 is a perspective view of a single solar cell 10 incorporating the invention. As seen in this figure, the solar cell comprises a substrate 12 of a suitable semiconductive material, such as Sb-doped n-type silicon. Deployed on the upper, front illumination surface of substrate 12 is an electrode structure comprising a plurality of individual stripes or fingers 14 ohmically interconnected along one end by means of a bus bar 15. Stripes 14 and bus bar 15 are preferably fabricated from aluminum with an overcoat of a solderable ohmic material, such as silver, as described below. Located along the lower, back surface of substrate 12 is a back electrode 17 (shown in full in FIG. 2), which is preferably composed of silver. Electrical connection to the cell 10 is made via bus bar 15 and back electrode 17. A passivation layer 18 of a suitable oxide material, such as $SiO_2$, is formed in the areas between stripes 14 along the top surface of substrate 12. The passivation layer also extends about the circumference of substrate 12 in the region between the top and bottom surfaces thereof.

Positioned on top of the passivation layer 18 is a coating 19 of a suitable antireflective material, such as titanium oxide. A silver layer 20 is located or positioned on top of the metal stripes 14 and the bus bar 15 in order to provide better ohmic contact with external circuitry.

Figure 3:
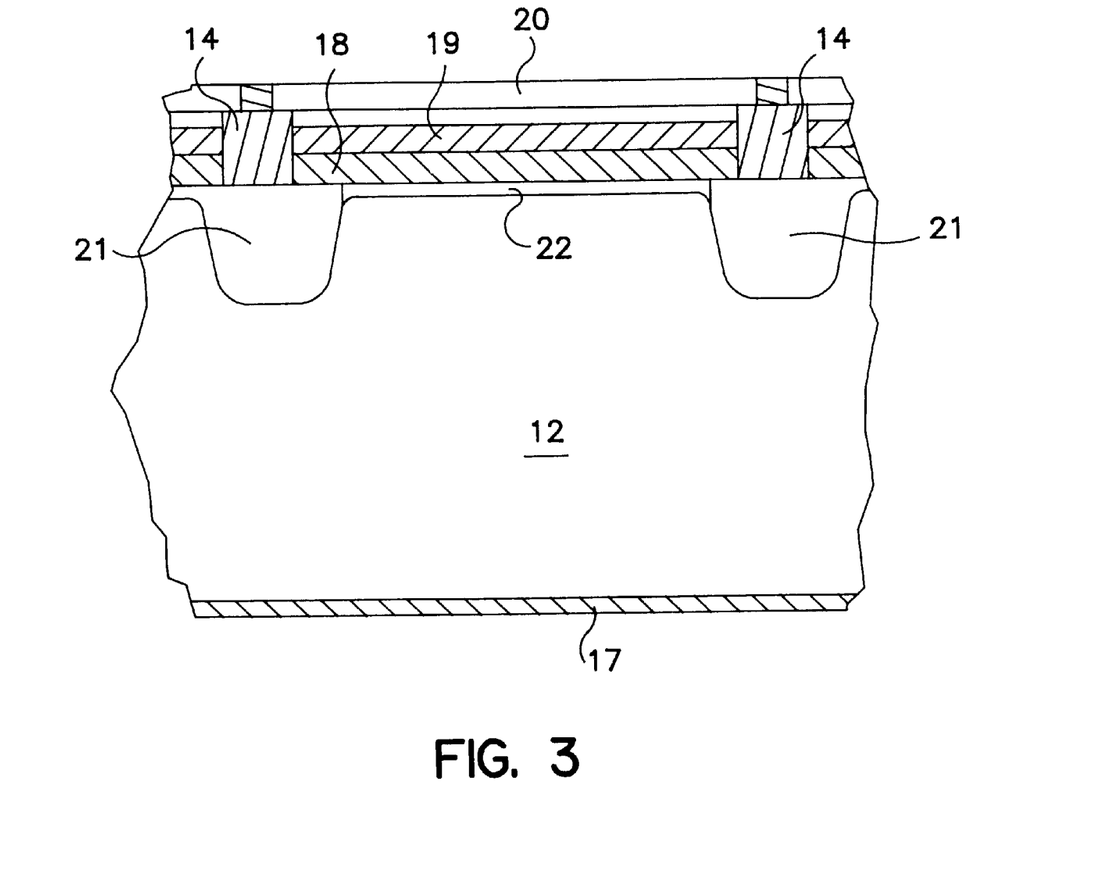
FIG. 3 is an enlarged sectional view of the FIG. 1 embodiment illustrating the junctions.

With reference to FIG. 3, the emitter structure of the solar cell comprises relatively deep emitter regions 21 underlying the metal electrode stripes 14 and relatively shallow emitter regions 22 underlying the regions of the substrate 12 surface not covered by the electrode stripes 14 and underlying the passivation layer 18. In the preferred embodiment, the emitter regions 21, 22 are p+ regions formed in the n-type substrate 12, thereby forming p-n junctions along the boundaries between the emitter regions 21, 22 and the substrate 12. The relatively deep regions 21 are at least moderately doped ($\sim 10^{18}$ cm$^{-3}$) p-type using aluminum as the dopant material and preferably extend to a depth from the top surface in the range from about 2 to about 10 $\mu$m. The range of dopant concentration for relatively deep regions 21 is from about $1 \times 10^{18}$ cm$^{-3}$ to about $5 \times 10^{21}$ cm$^{-3}$. The relatively shallow emitter regions 22 are relatively lightly doped (i.e., no greater than about $5 \times 10^{18}$ cm$^{-3}$) and extend to a depth from the top surface of substrate 12 no more than about 0.2 $\mu$m.

Figure 2:
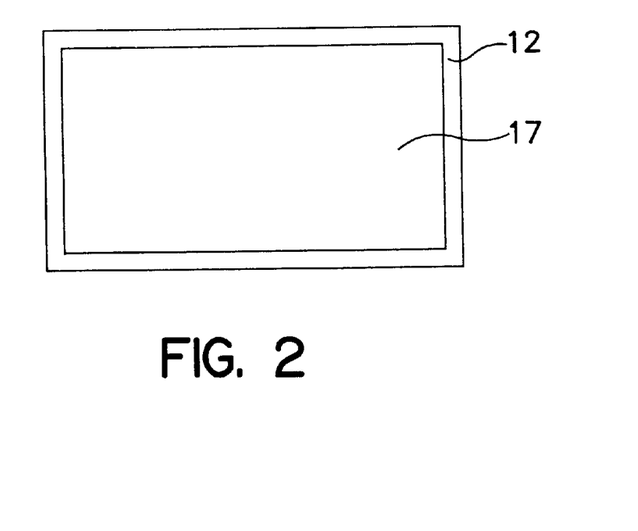
FIG. 2 is a bottom plan view of the FIG. 1 embodiment.
Figure 4A:
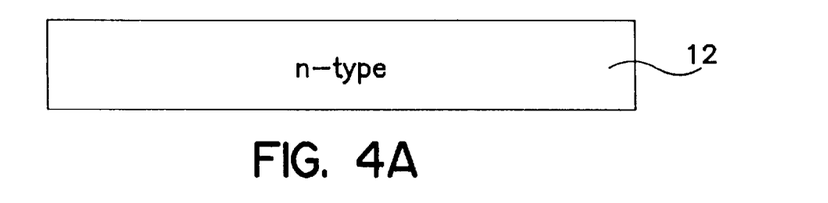
FIGS. 4A–4F are schematic sectional views illustrating the fabrication of the FIG. 1 embodiment.
Figure 4B:
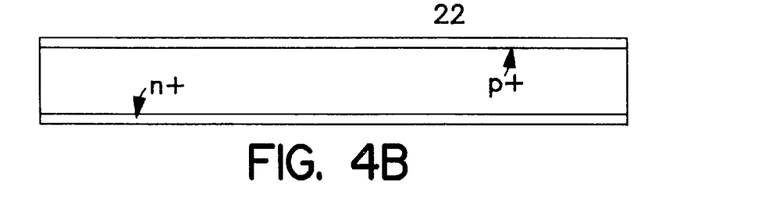

FIGS. 4A–4F illustrate the process for fabricating the solar cell shown in FIGS. 1–3. With reference to FIG. 4A, an n-type silicon substrate 12, preferably dendritic web silicon doped n-type with antimony, is first provided. Next, as shown in FIG. 4B, p+ and n+ layers are diffused into the upper and lower surfaces, respectively, of substrate 12. The p+ and n+ diffused layers are formed using any one of several known techniques, such as simultaneous front and back diffusion from a liquid dopant source using rapid thermal processing. The p+ dopant is preferably boron, while the n+ dopant is preferably phosphorus. The p+ layer creates the emitter for the cell and the n+ layer creates a back-surface field 25 to repel holes from the ohmic contact to the base. The back n+ layer also promotes ohmic contact to the negative contact metal electrode 17.

Figure 4C:
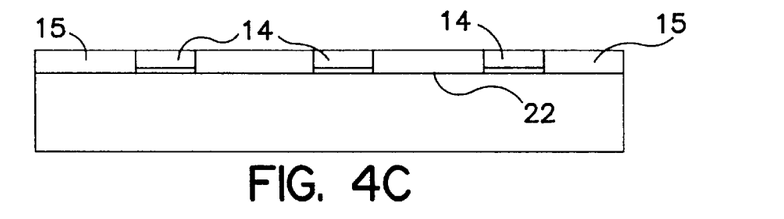

Next, fritless aluminum is screen printed over the front surface area in the FIG. 1 pattern, forming stripes 14 which are nominally 100 $\mu$m wide and spaced apart by approximately 1000 $\mu$m, and bus bar 15. The fritless aluminum may comprise pure aluminum as well as an aluminum/silicon alloy in which the silicon concentration is less than that required to form a eutectic composition. The result of this screen printing step is illustrated in FIG. 4C.

Figure 4D:
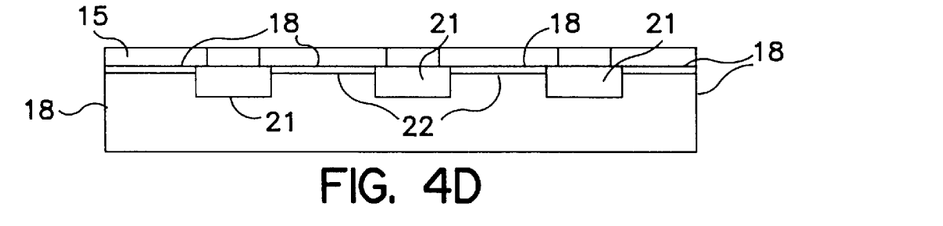

Next, the developing cell is heat treated at a temperature in the range from approximately 570° C. to about 1100° C. During this critical heat treat step, the aluminum alloys with the silicon (liquid phase) to a depth determined by the thickness of the aluminum originally deposited and in accordance with the known aluminum/silicon phase diagram. Next, the temperature is lowered and the silicon regrows by liquid phase epitaxy until the eutectic temperature (577° C.) is reached. The regrown silicon is doped p-type with the aluminum in a concentration of about $10^{18}$ cm$^{-3}$. The required p-n junction is formed as the aluminum concentration exceeds the donor concentration in the starting silicon, and the eutectic alloy (88.7% aluminum and 11.3% silicon, by weight) remains on the surface to serve as a contact to the p-type silicon. If the heat treatment is done in an oxygen ambient, a thin layer 18 of silicon dioxide is grown to a thickness of about 100 Å on the front surface of the substrate 12 to passivate the surface and thereby reduce surface recombination. In the absence of an oxygen ambient, a passivation layer can be separately provided. The result of the heat treat processing is illustrated in FIG. 4D. It is important to note that this one process step creates a deep emitter under the grid, a contact to the deep diffused emitter, and oxide passivation of the exposed emitter surface and the sides of the cell.

Figure 4E:
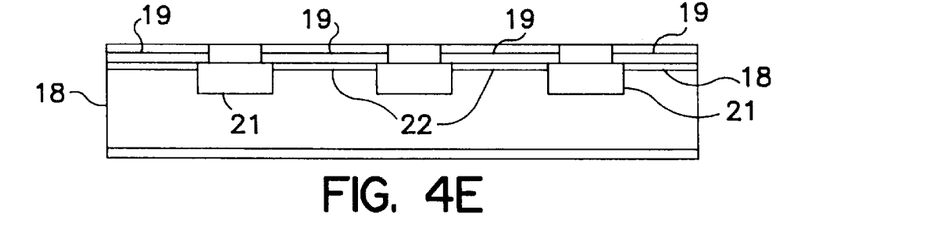
Figure 4F:
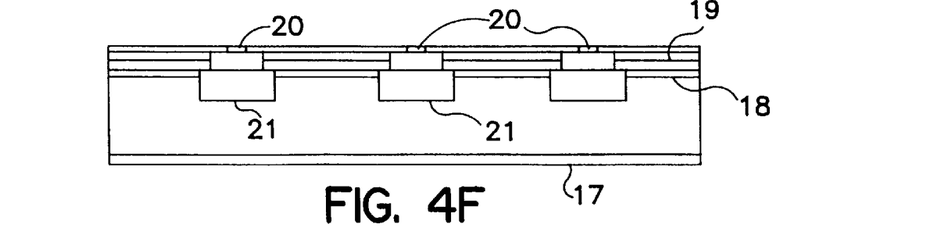

Next, a suitable antireflective (AR) coating 19, such as titanium oxide, is applied on the front surface of the developing cell using a technique such as atmospheric pressure chemical vapor deposition. The result of this process step is shown in FIG. 4E.

Figure 5:
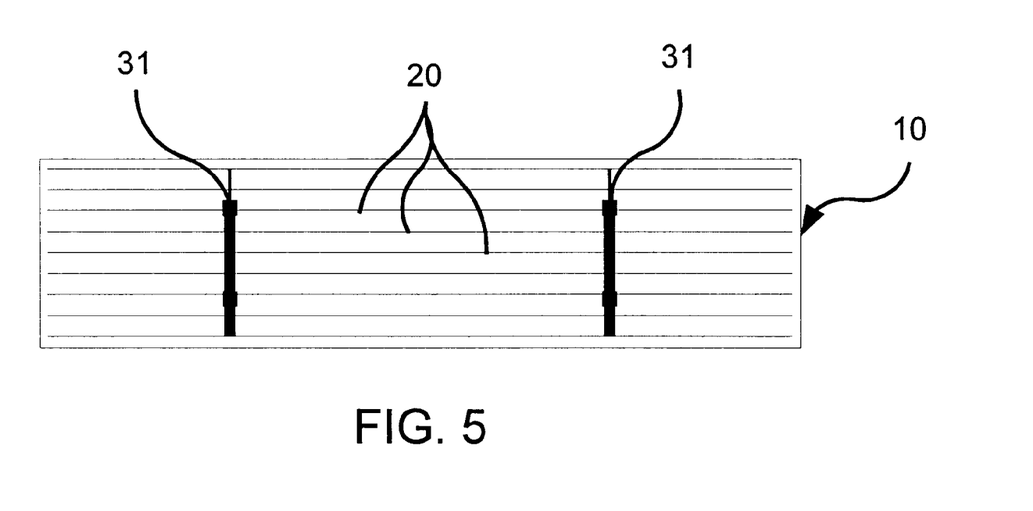
FIG. 5 is a top plan view showing an alternate top contact arrangement.

FIG. 5 illustrates an alternate surface contact arrangement for the top or front surface of a solar cell 10. As seen in this figure, a pair of relatively wider bus bar stripes 31 overlies the ohmic overlayer fingers 20 on the top surface of cell 10. Bus bar stripes 31 facilitate the interconnection between adjacent cells, which is normally deemed desirable in fabricating multiple cell structures.

Figure 6:
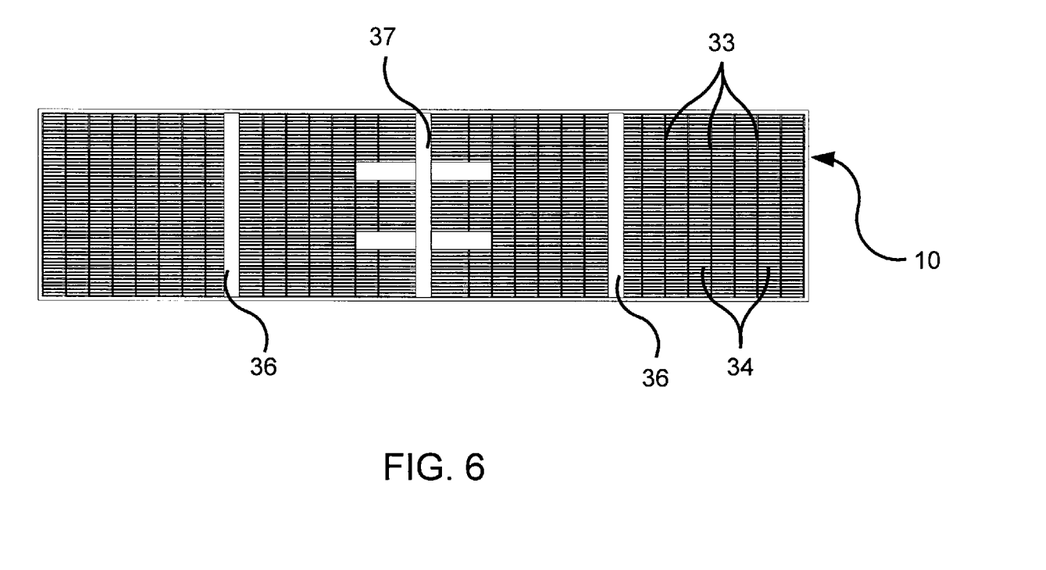
FIG. 6 is a bottom plan view showing an alternate bottom contact arrangement.

FIG. 6 illustrates in plan view an alternate ohmic contact pattern for the bottom or back surface of cell 10. As seen in this figure, the single solid ohmic back electrode 17 of the FIG. 2 embodiment is replaced with a patterned overlayer of ohmic contact material, such as silver. This patterned overlayer includes relatively narrow conductive lines 33 extending across the width of the bottom of cell 10, relatively narrow conductive lines 34 extending along the length of the bottom surface of cell 10 and ohmically connected to conductive lines 33, a pair of relatively broad conductive segments 36 extending across the width of the bottom surface of cell 10, and a central double cross shaped relatively broad conductive pattern 37. Conductive segments 36 are used to facilitate ohmic interconnection among a plurality of cells 10: pattern 37 provides a convenient external voltage probe contact when testing a given cell. The use of the pattern of FIG. 6 provides ample ohmic contact to the back surface of cell 10 while using substantially less ohmic conductive material. For example, in one cell embodiment silver contact material is used and covers approximately one-third of the surface area of the bottom surface of cell 10. In addition to reducing the amount of ohmic contact material required, the openings between the conductive lines in the FIG. 6 arrangement permits light photons to pass entirely through the cell, which results in lower operating temperatures and is thus desirable. Further, use of the FIG. 6 pattern has been found to substantially reduce individual cell warping which is sometimes encountered with the single solid back contact arrangement 17 illustrated in FIG. 2.

Next, an ohmic conductive metal layer 17 is screen printed and fired onto the back surface to form the bottom electrode and an overlayer 20 of solderable material such as silver is screen printed and fired on top of the aluminum electrode pattern 14, 15 on the front surface. The finally finished cell is illustrated in section in FIG. 4F.

Solar cells fabricated according to the teachings of the invention afford a number of advantages. Firstly, the combination of deep moderately doped emitter regions under the electrodes and shallow lightly doped emitter regions under the exposed non-contacted regions acts to minimize recombination of holes and electrons in a functioning solar cell. In addition, the use of fritless aluminum enables the formation of the relatively deep emitter regions, provides a positive contact ohmic electrode material and supplies a gettering agent to remove impurities and enhance the bulk lifetime, all in a single process step. Importantly, the ohmic metal contacts to the deep diffused emitter regions are self-aligned during the heat treat process step, thereby eliminating any need for additional photolithography steps to perform the electrode alignment required in prior art processing. Further, by using fritless aluminum, the problem of higher resistance encountered in prior art processes employing a mixture of aluminum and glass frit is significantly reduced, thereby simplifying the heat treat process step. Further, the application of the solderable metal (e.g. silver layer 20) over the aluminum alloy contact electrodes 14, 15 facilitates the interconnection of many cells together in order to achieve a higher power generation capability. Also, the use of the patterned bottom cell ohmic contact layer of FIG. 6 provides cooler cell operation, substantially reduces cell warping, and consumes less ohmic contact material per cell. Lastly, the invention is tolerant of a non-uniform emitter, since the aluminum electrodes dope the underlying silicon p-type. It is even possible for the emitter to have n-type islands within the p-type region without deleterious effects.

Although the p-n junction at the boundary of deep emitter regions 21 may be quite deep (i.e., in the range from about 2 to about 10 $\mu$m), since this junction is under the electrodes 14 only, it screens the base of the solar cell from the contact metal and is therefore beneficial. The depth of the alloy junction can be controlled by using an aluminum/silicon alloy as the screen printed material instead of pure aluminum. In general, as the silicon concentration in such an alloy is increased toward the eutectic composition, the amount of silicon that the printed aluminum can dissolve decreases. As a consequence, the depth of the finished junction also decreases.

In addition, the minority carrier lifetime will increase in web silicon as the point defects that are quenched in during crystal growth are annealed during the heat treating step of the process. The minority carrier lifetime will also increase in other forms of silicon than dendritic web silicon because of the phenomenon of impurity gettering associated with the aluminum-silicon alloying process. Having the relatively deep p+ region 21 immediately adjacent the relatively shallow p+ region 22 provides the benefit of having a deep and moderately doped emitter under the grid and a shallow and lightly doped emitter under the passivation layer 18.

The following is a specific example of solar cells fabricated according to the teachings of the invention. Dendritic web silicon strips 10 cm long and 2½ cm wide by 100 $\mu$m thick were simultaneously diffused after dopant application (phosphorus and boron on opposite sides of the web strips) in a rapid thermal processing system. Aluminum paste with no glass frit was printed on the emitter side of the web strips to a thickness of 15 $\mu$m and fired at 800° C. for 60 seconds in a belt furnace with an air ambient. SEM pictures of the p+ diffused layer under the aluminum paste showed a junction depth of 2.4–5 $\mu$m. The fabricated solar cell had a single layer titanium oxide antireflective coating. Measured parameters for the best cell (25 cm squared area) indicated a short circuit current of 27.46 mA/cm squared and open circuit voltage of 0.586 V, a fill factor of 0.756, and an energy conversion efficiency of 12.17%. Although this process was not optimized to obtain high efficiency, the fill factor of 0.756 is considered respectable for screen printed solar cells.

While the above provides a full and complete disclosure of the preferred embodiments of the invention, various modifications, alternate constructions and equivalents may be employed, as desired. For example, while the invention has been described with reference to rectangular geometry, other geometries such as circular may be employed, as desired. In addition, while specific oxide and antireflective coatings have been indicated, other oxides and other antireflective substances may also be employed. Therefore, the above description and illustrations should not be construed as limiting the scope of the invention, which is defined by the appended claims.

What is claimed is:

1. A solar cell comprising:
   an n-type semiconductive substrate having a front surface and a back surface;
   a first plurality of emitter regions formed in said front surface to a relatively shallow depth with a relatively lightly doped p-type concentration;
   a second plurality of emitter regions formed in said front surface to a substantially greater depth than said first plurality of regions with an at least moderately doped p-type concentration, said first and second plurality of regions being interspersed;
   a dopant region formed in said back surface for providing a back surface field;
   an ohmic contact formed over said dopant region; and
   a first patterned ohmic electrode layer containing aluminum formed over said second plurality of emitter regions.

2. The solar cell of claim 1 wherein said first plurality of p-type emitter regions is fabricated using boron.

3. The solar cell of claim 1 wherein said second plurality of p-type emitter regions is fabricated using aluminum.

4. The solar cell of claim 1 wherein said second plurality of p-type emitter regions is fabricated using an alloy of aluminum and silicon.

5. The solar cell of claim 1 wherein said dopant region is formed using an n+ type dopant material.

6. The solar cell of claim 5 wherein said dopant material is phosphorus.

7. The solar cell of claim 1 wherein said first plurality of emitter regions has a depth no greater than about 0.2 $\mu$m.

8. The solar cell of claim 1 wherein said first plurality of emitter regions has a concentration not greater than about $5 \times 10^{18}$ cm$^{-3}$.

9. The solar cell of claim 1 wherein said second plurality of emitter regions has a minimum depth of about 2 $\mu$m.

10. The solar cell of claim 1 wherein said second plurality of emitter regions has a concentration no less than about $1 \times 10^{19}$ cm$^{-3}$.

11. The solar cell of claim 1 wherein said ohmic contact is formed from silver.

12. The solar cell of claim 1 further including a second patterned layer of a solderable ohmic material formed over said first patterned ohmic electrode layer.

13. The solar cell of claim 12 wherein said solderable material is silver.

14. The solar cell of claim 1 further including a passivation layer formed on said one of said first and second surfaces in regions between said first patterned ohmic contact layer.

15. The solar cell of claim 14 further including an antireflective layer formed over said passivation layer.

16. A method of fabricating a solar cell having self-aligned locally deep-diffused emitters, said method comprising the steps of:
   (a) providing an n-type semiconductive substrate having a front surface and a back surface;
   (b) forming a relatively shallow p-type emitter region in said front surface;
   (c) forming a relatively shallow n-type field region in the back surface;
   (d) providing a patterned layer containing aluminum on said front surface;
   (e) heating said substrate to form a plurality of relatively deep p-type emitter regions in said substrate in regions underlying said patterned layer; and
   (f) providing an ohmic contact to said back surface.

17. The method of claim 16 wherein said relatively shallow field region is formed using an n+-type dopant material.

18. The method of claim 16 further including the step of applying an ohmic patterned layer over said patterned layer containing aluminum.

19. The method of claim 16 further including the step of forming a passivation layer over said front surface in regions not covered by said patterned layer.

20. The method of claim 16 further including the step of forming a layer of antireflective material over said passivation layer.

21. The method of claim 16 wherein said step (b) of forming is conducted to provide emitter regions having a depth no greater than about 0.2 $\mu$m.

22. The method of claim 16 wherein said step (b) of forming is conducted to provide emitter regions having a dopant concentration not greater than about $5 \times 10^{18}$ cm$^{-3}$.

23. The method of claim 16 wherein said step (e) of heating is conducted to provide emitter regions having a minimum depth of about 2 $\mu$m.

24. The method of claim 16 wherein said step (e) of heating is conducted to provide relatively deep emitter regions having a dopant concentration no less than about $1 \times 10^{18}$ cm$^{-3}$.

25. The method of claim 16 wherein said step (d) of providing is conducted with pure aluminum.

26. The method of claim 16 wherein said step (d) of providing is conducted using a mixture of aluminum and silicon.

* * * * *